United States Patent [19]

Mori

[11] Patent Number: 5,936,289
[45] Date of Patent: *Aug. 10, 1999

[54] SEMICONDUCTOR DEVICE

[75] Inventor: Hideki Mori, Kanagawa, Japan

[73] Assignee: Sony Corporation, Tokyo, Japan

[ * ] Notice: This patent is subject to a terminal disclaimer.

[21] Appl. No.: 08/935,937

[22] Filed: Sep. 23, 1997

Related U.S. Application Data

[63] Continuation of application No. 08/708,654, Sep. 5, 1996, Pat. No. 5,731,620.

[30] Foreign Application Priority Data

Sep. 8, 1995 [JP] Japan .................................... 7-230970

[51] Int. Cl.$^6$ .................................................. H01L 23/48
[52] U.S. Cl. ............................ 257/386; 257/776; 257/786
[58] Field of Search .................................... 257/386, 490, 257/630, 740, 758, 776, 786

[56] References Cited

U.S. PATENT DOCUMENTS 5,731,620 3/1998 Mori ........................................ 257/386

FOREIGN PATENT DOCUMENTS 1-231336   9/1989   Japan .
2 243 485  10/1991  United Kingdom .

Primary Examiner—Peter Toby Brown
Assistant Examiner—Roy Potter
Attorney, Agent, or Firm—Hill & Simpson

[57] ABSTRACT

A semiconductor device which solves the problem of parasitic substrate capacitance attenuating signal processing speed and reducing IC operating speed. An N-type semiconductor layer 12 is formed on a P-type semiconductor base 11, and an insulating film 13 and a pad 16 are formed on the semiconductor layer 12. A P-type isolating diffusion layer 20 is formed in part of the semiconductor layer 12 below the insulating film 13. An N-type impurity diffusion layer 17 connected to the semiconductor layer 12 is formed on the semiconductor layer 12, and an electrode 19 connected to the impurity diffusion layer 17 through a connecting hole 18 formed in the insulating film 13 above the impurity diffusion layer 17 is so formed that it is electrically independent from the pad 16. The isolating diffusion layer 20 is formed outside the outer periphery of the impurity diffusion layer 17 and so that the PN junction between the semiconductor base 11 and the semiconductor layer 12 exists in at least a part of the area below the pad 16. In this semiconductor device, because the PN junction between the semiconductor base and the semiconductor layer exists in at least a part of the area below the pad, this PN junction capacitance is connected in series with the pad. As a result, the parasitically connected so-called substrate (semiconductor base) capacitance is reduced. Also, by impressing a reverse field across the semiconductor layer and the semiconductor base from this electrode 19, the PN junction capacitance can be reduced in the width of a depletion layer.

9 Claims, 17 Drawing Sheets

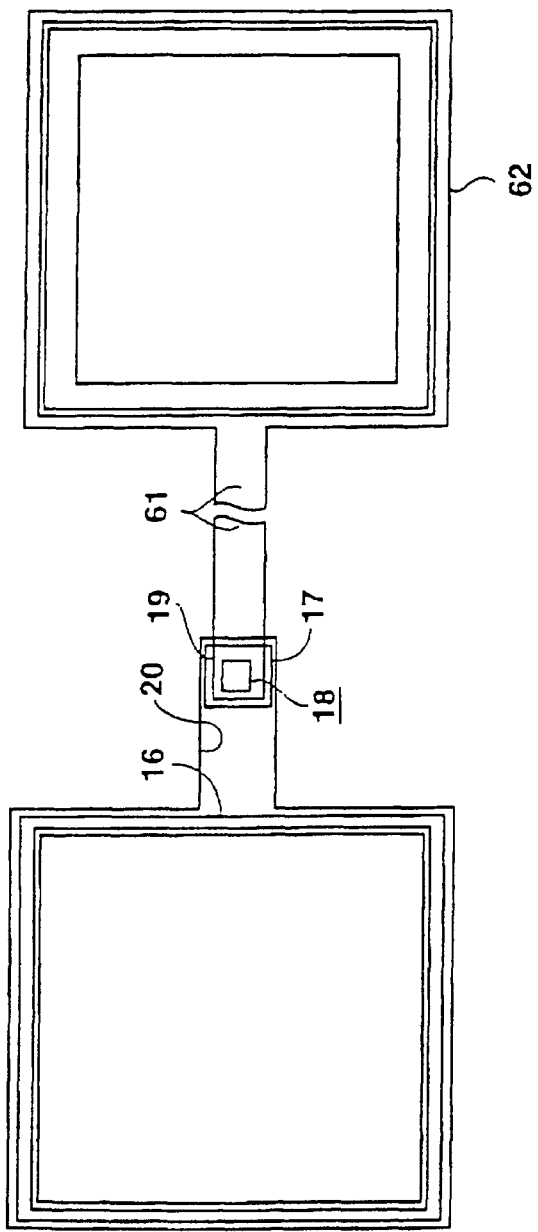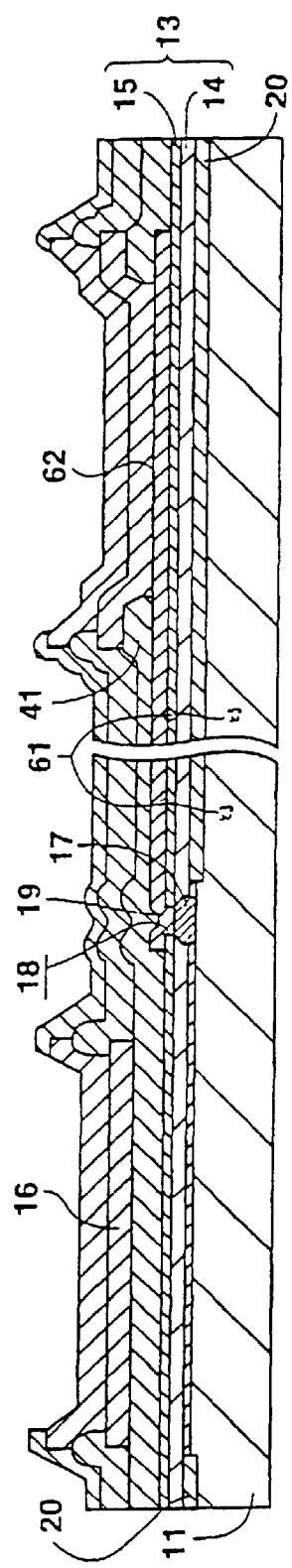

SEMICONDUCTOR DEVICE

This is a continuation, of application Ser. No. 08/708,654 filed Sep. 5. 1996, now U.S. Pat. No. 5,731,620.

BACKGROUND OF THE INVENTION

This invention relates to a semiconductor device, and particularly to semiconductor device a having a so-called 'pad'.

Along with a rapid expansion of the portable information terminal market in recent years, the realization of high integration, high speed and low power consumption of VLSI circuits has been progressing markedly. This can be said to be a result of much research relating to performance improvements based on increases in the speed and miniaturization of individual devices constituting VLSI circuits.

A pad of the related art will now be described with reference to the schematic sectional construction view of FIG. 1.

As shown in FIG. 1, for example an N-type epitaxial layer (112) is formed on a P-type substrate 111, and a P-type isolating diffusion layer 113 and a device separation oxide film 114 formed by LOCOS (Local Oxidation of Silicon) are formed on this N-type epitaxial layer (112). Also, a so-called field oxide film 115 is formed on the device separation oxide film 114. A pad 116 of a three-layer aluminum structure is formed on the field oxide film 115.

However, particularly in the realization of high speed, there have been cases where even if the speed of the internals of an IC is increased it is not possible to improve the operating speed of the IC itself because its signal processing speed is attenuated by substrate capacitance parasitically connected to the wire bonding regions, or pads, of the IC.

In the operation of an ordinary IC comprising a semiconductor device having the pad structure described above in reference to the related art, power is supplied to the device through a wire bonded to the surface of a conducting layer constituting the uppermost layer of the pad, and the P-type substrate is grounded at all times. Consequently, the conducting layers making up the three-layer aluminum structure pad become an upper electrode, the P-type substrate and the P-type isolating diffusion layer act as a lower electrode, and the field oxide film and the device separation oxide film act as an oxide film capacitance. As a result, because this amounts to a capacitance being connected in series between the pad and the P-type substrate, improvement of the operating speed of the IC has been hindered.

This parasitically connected oxide film capacitance decreases with reductions in pad surface area accompanying increased integration of VLSI circuits but increases with reductions in the thickness of the field oxide film accompanying voltage reductions and greater miniaturization.

Thus, in the related art structure, there has been a limit to reduction of the parasitic capacitance connected to the pad, and improving IC operating speeds along with increases in device speeds has been problematic.

SUMMARY OF THE INVENTION

This invention is a semiconductor device designed to solve the problem described above and other problems, and it is an object of the invention to provide a semiconductor device having a pad structure which greatly reduces the parasitic substrate capacitance connected to the pad.

According to the invention, on a semiconductor base of a first conductive type is formed a semiconductor layer of a second conductive type opposite to the first conductive type. An insulating film is formed on the semiconductor layer, and a pad comprising a conducting film is further formed on this insulating film. In this semiconductor device, an impurity diffusion layer of the second conductive type and connected to the semiconductor layer is formed in the semiconductor layer, a connecting hole is formed in the insulating film on this impurity diffusion layer, and there is provided an electrode electrically independent from the pad and connected to the impurity diffusion layer through this connecting hole. Also, the PN junction between the semiconductor base and the semiconductor layer exists in at least a part of the area below the pad.

In this semiconductor device, because the PN junction between the semiconductor base and the semiconductor layer exists in at least a part of the area below the pad, this PN junction capacitance is connected in series with the pad. As a result, the parasitically connected so-called substrate (semiconductor base) capacitance is reduced.

Also, because an impurity diffusion layer of the second conductive type and connected to the semiconductor layer is formed on the semiconductor layer and there is provided an electrode electrically independent from the pad and connected to the impurity diffusion layer through a connecting hole formed in the insulating film on this impurity diffusion layer, by impressing a reverse field across the semiconductor layer and the semiconductor base from this electrode the PN junction capacitance can be reduced in the width of a depletion layer.

In this semiconductor device, an interlayer insulating film covering the electrode may be formed on the insulating film and the pad may be formed on this interlayer insulating film.

With a construction wherein an interlayer insulating film is formed in this way, because the insulating film below the pad becomes thicker by the film thickness of the interlayer insulating film, the so-called substrate (semiconductor base) capacitance is further reduced.

Also, in this semiconductor device, the impurity diffusion layer and the connecting hole and the electrode may be disposed below the pad and an interlayer insulating film covering the electrode may be provided between the insulating film and the pad.

With a construction wherein the impurity diffusion layer and the connecting hole and the electrode are disposed below the pad in this way, because the areas occupied by the impurity diffusion layer and the connecting hole and the electrode are relatively small compared to that of the pad, there are no restrictions of area on their formation. Since the degree of freedom of the design layout is therefore raised, this contributes to increasing the level of integration.

Also, in this semiconductor device, an interconnection connected to the electrode may be formed on the insulating film and a power supply pad may be connected to this interconnection.

With a construction wherein a power supply pad connected to the electrode by an interconnection is formed, a potential can be impressed on the electrode from outside by way of the power supply pad.

BRIEF DESCRIPTION OF THE DRAWINGS

FIGS. 16A and 16B are views illustrating a second preferred embodiment of the third practicing mode.

BEST MODES OF PRACTICING THE INVENTION

A first practicing mode of the invention will now be described with reference to the schematic sectional construction view of FIG. 2.

Figure 1:
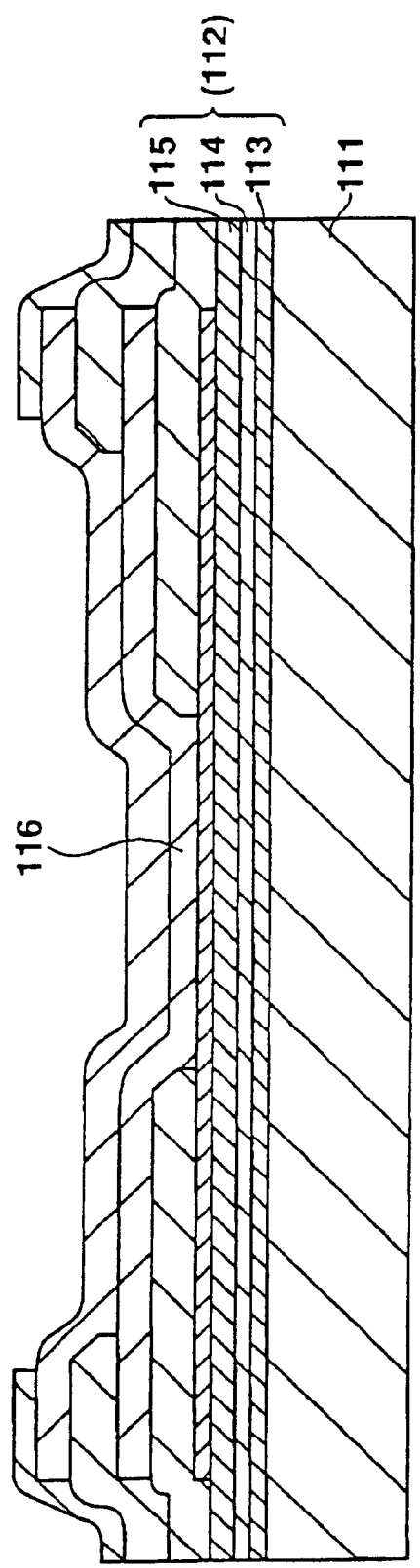
FIG. 1 is a view illustrating a pad of the related art.
Figure 2:
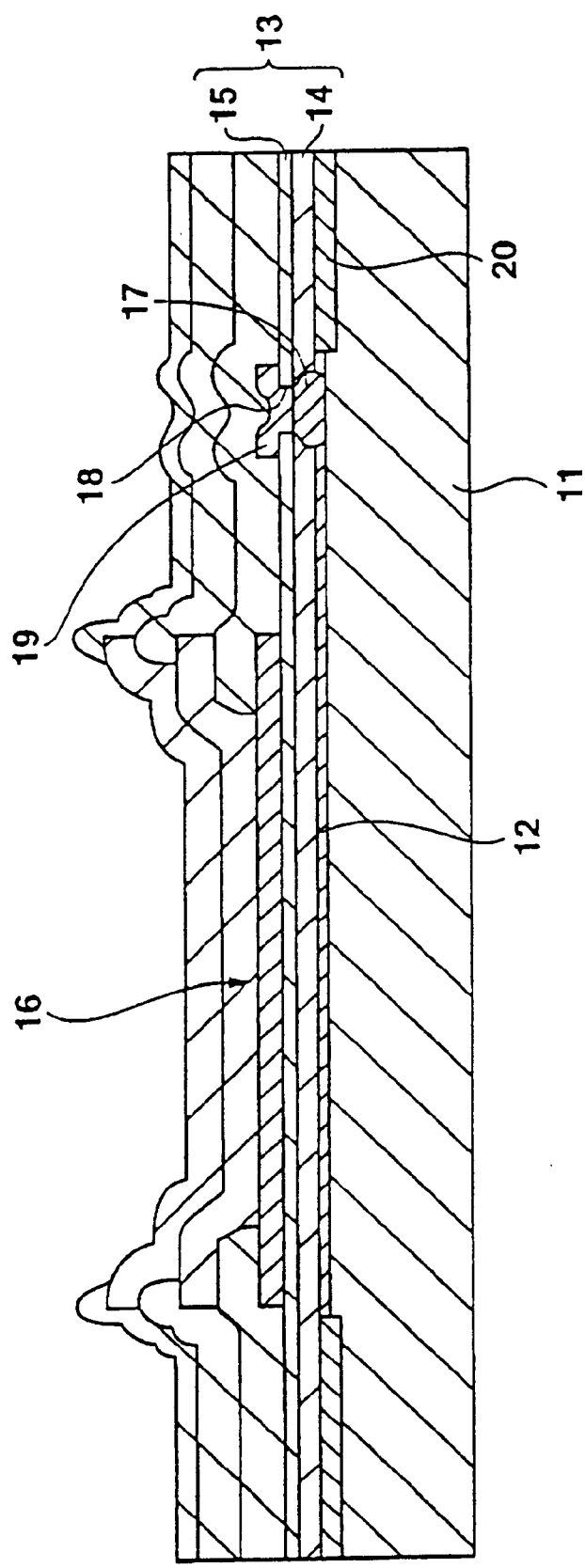
FIG. 2 is a schematic sectional construction view of a first practicing mode of the invention.

As shown in FIG. 2, on a semiconductor base 11 of a first conductive type (which for example in this description will be the P-type) is formed a semiconductor layer 12 of a second conductive type (which for example in this description will be the N-type) opposite to the first conductive type.

An insulating film 13 consisting of for example silicon oxide is formed on the semiconductor layer 12. This insulating film 13 is made up of a device separation oxide film 14 formed by for example LOCOS (Local Oxidation of Silicon) and a field oxide film 15 formed on the device separation oxide film 14 and on the semiconductor layer 12.

A pad 16 made up of conducting films is formed on the insulating film 13. Normally, this pad 16 is made of for example an aluminum-based metal.

A second conductive type (N-type) impurity diffusion layer 17 connected to the semiconductor layer 12 is formed in the semiconductor layer 12 to the side of the pad 16.

A connecting hole 18 is formed in the insulating film 13 above this impurity diffusion layer 17. An electrode 19 is formed in this connecting hole 18 in such a state that it is electrically independent from the pad 16 and connected to the impurity diffusion layer 17.

At the boundary between the semiconductor base 11 and the semiconductor layer 12, a first conductive type (P-type) isolating diffusion layer 20 is formed outside the side periphery of the impurity diffusion layer 17 and in such a state that the PN junction between the semiconductor base 11 and the semiconductor layer 12 exists in at least a part of the area below the pad 16.

In a semiconductor device having the construction described above, because the PN junction between the semiconductor base 11 and the semiconductor layer 12 exists in at least a part of the area below the pad 16, this PN junction capacitance is in series with the pad 16. As a result, the parasitically connected so-called substrate capacitance of the semiconductor base 11 is reduced.

Also, because the impurity diffusion layer 17 of the second conductive type and connected to the semiconductor layer 12 is formed on the semiconductor layer 12 and the electrode 19 connected to the impurity diffusion layer 17 through the connecting hole 18 formed in the insulating film 13 above the impurity diffusion layer 17 is provided in such a state that it is electrically independent from the pad 16, by impressing a reverse field across the semiconductor layer 12 and the semiconductor base 11 from this electrode 19 it is possible to reduce the PN junction capacitance in a depletion layer width.

Figure 3A:
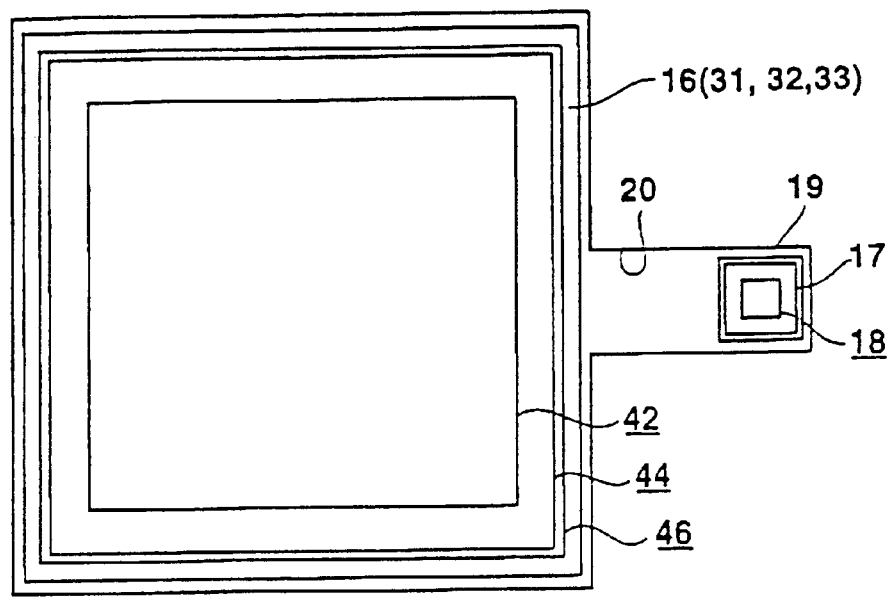
FIGS. 3A and 3B are views illustrating a first preferred embodiment of the first practicing mode.

Next, a first preferred embodiment of the first practicing mode described above will be described in detail with reference to FIGS. 3A and 3B. FIG. 3A is a layout view and FIG. 3B is a schematic sectional construction view.

Figure 3B:
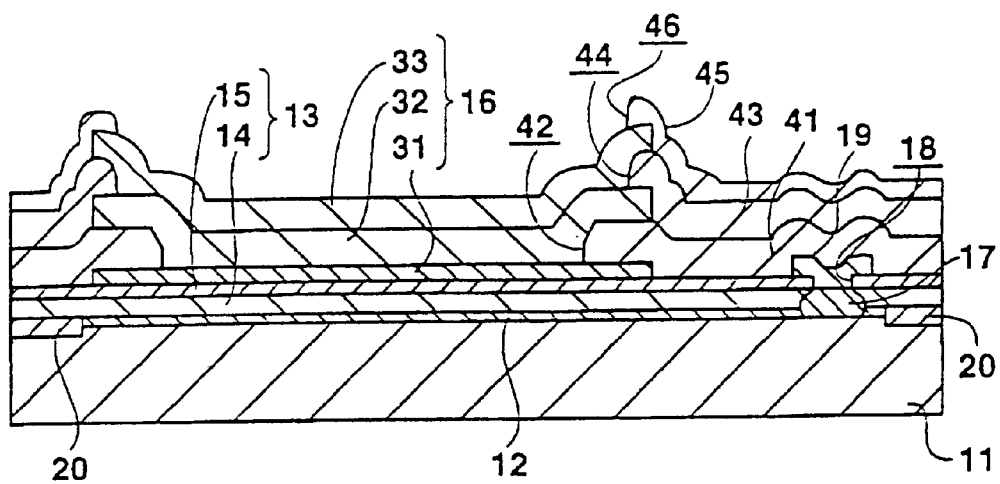

As shown in FIGS. 3A and 3B, the construction of a semiconductor base 11, a semiconductor layer 12 and an insulating film 13 (a device separation oxide film 14 and a field oxide film 15) is the same as that described above in reference to the first practicing mode.

Also, a second conductive type (N-type) impurity diffusion layer 17 connected to the semiconductor layer 12 is formed in the semiconductor layer 12 to the side of the pad 16. A connecting hole 18 is formed in the insulating film 13 above this impurity diffusion layer 17, and an electrode 19 is formed in this connecting hole 18 so that it is electrically independent from the pad 16 and is connected to the impurity diffusion layer 17.

The pad 16 is made up of conductive layers such as for example three layers of an aluminum-based metal. That is, a first conductive layer 31 is formed on the insulating film 13. This first conducting layer 31 was formed with the same layer as the electrode 19. Then a first interlayer insulating film 41 is formed covering the first conducting layer 31 and the electrode 19. A connection opening 42 is formed in this first interlayer insulating film 41, and a second conducting layer 32 is connected to the first conducting layer 31 through this opening 42. A second interlayer insulating film 43 is then formed covering the second conducting layer 32. A connection opening 44 is formed in this second interlayer insulating film 43, and a third conducting layer 33 is connected to the second conducting layer 32 through this opening 44. A so-called overcoat film 45 is formed covering the third conducting layer 33, and a connection opening 46 exposing the third conducting layer 33 is formed in this overcoat film 45.

At the boundary between the semiconductor base 11 and the semiconductor layer 12, a first conductive type (P-type) isolating diffusion layer 20 is formed outside the side periphery of the impurity diffusion layer 17 and in such a state that the PN junction between the semiconductor base 11 and the semiconductor layer 12 exists over the entire area below the pad 16. Furthermore, the junction between the semiconductor layer 12 and the semiconductor base 11 remains in such a state that it connects the area below the pad 16 to the impurity diffusion layer 17.

With a semiconductor device of the construction described above with reference to FIG. 3A and FIG. 3B, the same effects as those described in reference to the first practicing mode were obtained.

That is, because the PN junction between the semiconductor base 11 and the semiconductor layer 12 exists over the entire area below the pad 16, this PN junction capacitance is connected in series with the pad 16. As a result, the parasitically connected so-called substrate capacitance of the semiconductor base 11 is reduced.

Also, because an impurity diffusion layer 17 of the second conductive type and connected to the semiconductor layer 12 was in the semiconductor layer 12 and an electrode 19 connected to the impurity diffusion layer 17 through a connecting hole 18 formed in the insulating film 13 above the impurity diffusion layer 17 was provided in such a state that it was electrically independent from the pad 16, by impressing a reverse field across the semiconductor layer 12 and the semiconductor base 11 from this electrode 19 it was possible to reduce the PN junction capacitance in a depletion layer width.

An example of a method for manufacturing the semiconductor device of the first preferred embodiment described above will now be described with reference to the manufacturing process views of FIG. 4A to 4C and FIG. 6A to 6C. In FIG. 4A to 4C and FIG. 6A to 6C a method for manufacturing the semiconductor device by a bipolar process is shown, and constituent parts the same as parts described with reference to FIG. 2 and FIGS. 3A and 3B have been given the same reference numerals.

Figure 4A:
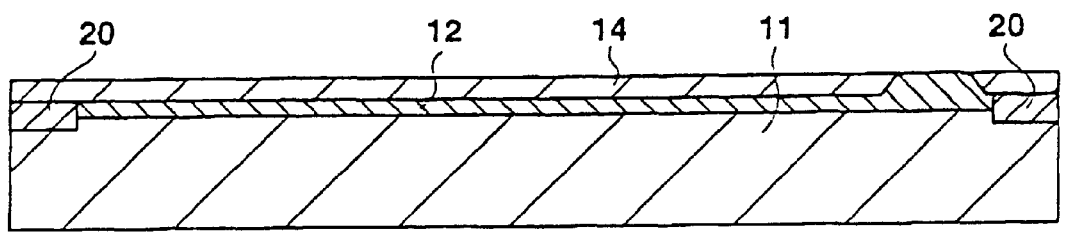
FIGS. 4A through 4C are (first) manufacturing process views of a semiconductor device according to the first preferred embodiment.

As shown in FIG. 4A, a semiconductor layer 12 consisting of an N-type silicon layer was formed by epitaxial growth on a semiconductor base 11 consisting of a P-type silicon substrate. After that, by LOCOS, a device separation oxide film 14 to constitute part of an insulating film was formed on the semiconductor layer 12. Then, by ion injection, a P-type impurity was introduced into a predetermined region of the semiconductor layer 12 below the device separation oxide film 14 to form a P-type isolating diffusion layer 20 joining with the semiconductor base 11.

When the process described above with reference to FIG. 4A is carried out in a so-called MOS process, CMOS process or Bi-CMOS process, alternatively, instead of forming a semiconductor layer 12 consisting of an epitaxial layer as described above, an N-well region (not shown) of a P-channel MOS may be formed on the semiconductor base 11, which is a P-type silicon substrate, and used as the semiconductor layer 12.

Figure 4B:
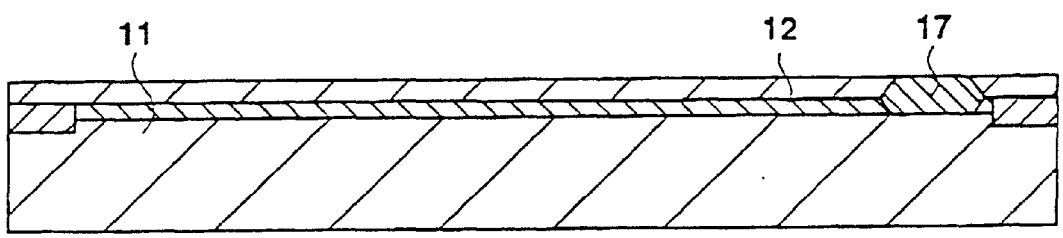

Next, as shown in FIG. 4B, by ion injection, an N-type impurity diffusion layer 17 to constitute a takeout region for supplying a potential to the semiconductor layer 12 was formed in the semiconductor layer 12.

When for example forming an N-type collector takeout region formed in an NPN transistor or a graft base region of a vertical-type PNP transistor, the impurity diffusion layer 17 can be formed by the same process.

When the process described above with reference to FIG. 4B is carried out in a so-called MOS process or CMOS process, it can be combined with an ion injection for forming a source/drain diffusion layer of an N-channel transistor.

Figure 4C:
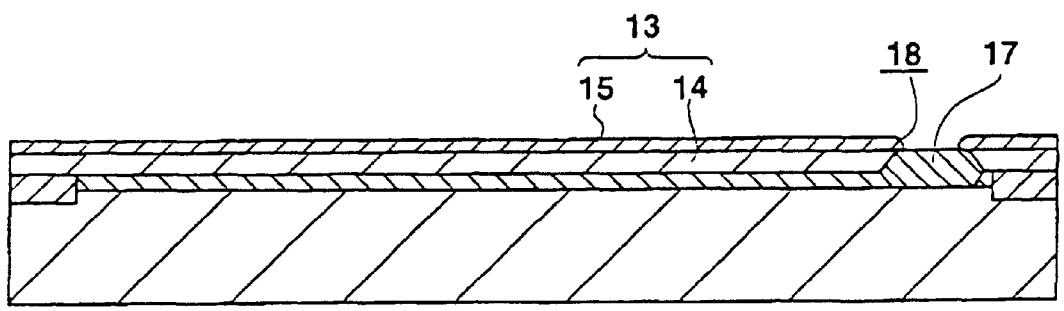

Next, as shown in FIG. 4C, by for example chemical vapor deposition (CVD), a field oxide film 15 consisting of silicon oxide is formed over the entire surface of the device separation oxide film 14 side to a thickness of for example 600 nm. In this way, an insulating film 13 was formed out of the device separation oxide film 14 and the field oxide film 15.

Then, by lithography and etching (dry etching or wet etching), a connecting hole 18 was formed in the field oxide film 15 above the impurity diffusion layer 17.

Figure 5A:
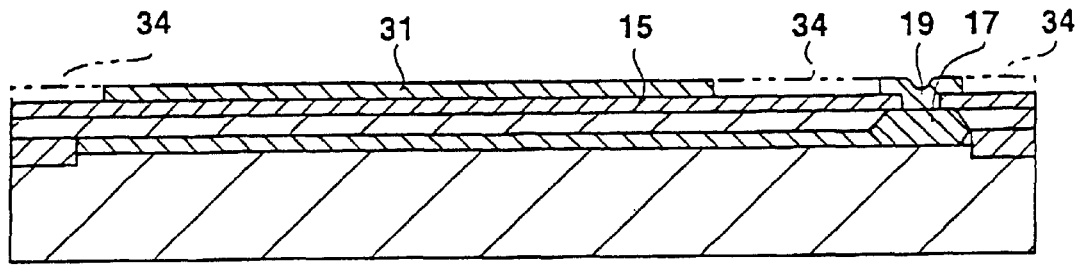
FIGS. 5A through 5C are (second) manufacturing process views of a semiconductor device according to the first preferred embodiment.

Then, as shown in FIG. 5A, for example by sputtering, a first interconnection layer 34 to constitute an interconnection material was formed over the entire field oxide film 15. This first interconnection layer 34 consists of for example an aluminum film or a laminated film made up of a titanium (Ti) film, a titanium oxynitride (TiON) film, a titanium film and an aluminum-silicon alloy film.

After that, for example by lithography and etching, patterning was carried out to remove the-part of the first interconnection layer 34 shown with broken lines, and a first conducting layer 31 to constitute part of a pad and an electrode 19 connected to the impurity diffusion layer 17 were formed.

Figure 5B:
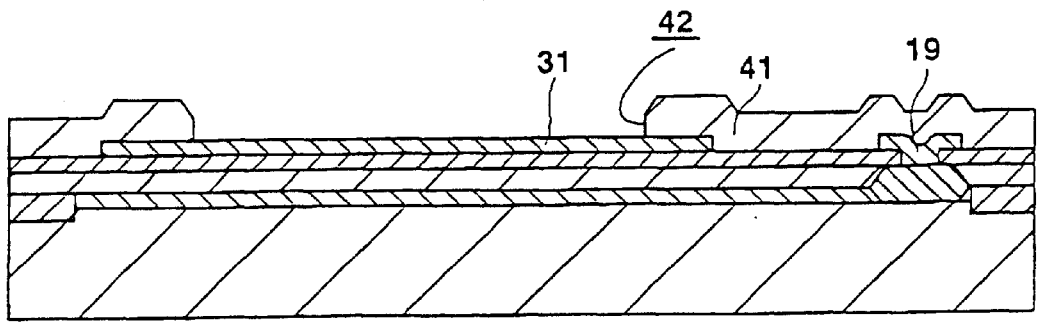

After that, as shown in FIG. 5B, for example by CVD, a first interlayer insulating film 41 was formed covering the first conducting layer 31 and the electrode 19. Then, by lithography and etching (for example plastic etching or reactive ion etching or the like), an opening 42 exposing the first conducting layer 31 was formed in the first interlayer insulating film 41.

The first interlayer insulating film 41 was formed as for example a laminated film consisting of a silicon nitride film and a silicon oxide film.

Figure 5C:
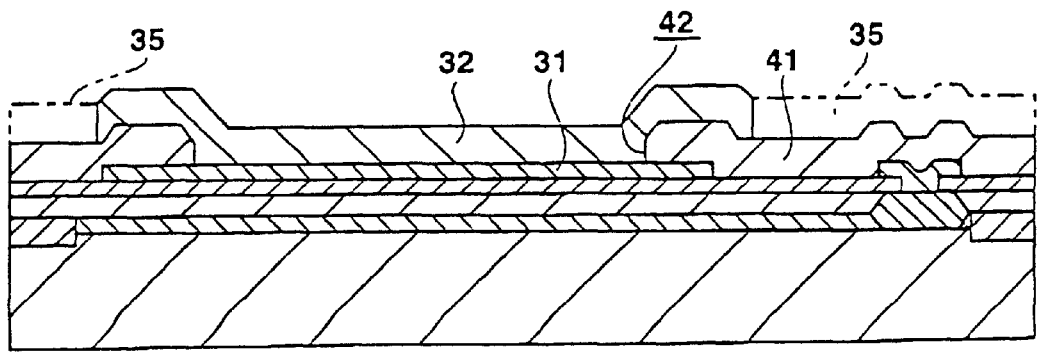

Then, as shown in FIG. 5C, by for example sputtering, a second interconnection layer 35 to constitute an interconnection material was formed over the entire surface of the first interlayer insulating film 41 side. This second interconnection layer 35 consists of for example an aluminum film or a laminated film consisting of a titanium (Ti) film and an aluminum-silicon alloy film.

After that, for example by lithography and etching, patterning was carried out to remove the part of the second interconnection layer 35 shown with broken lines, and then a second conducting layer 32 connected to the first conducting layer 31 through the opening 42 and constituting part of the pad was formed.

Figure 6A:
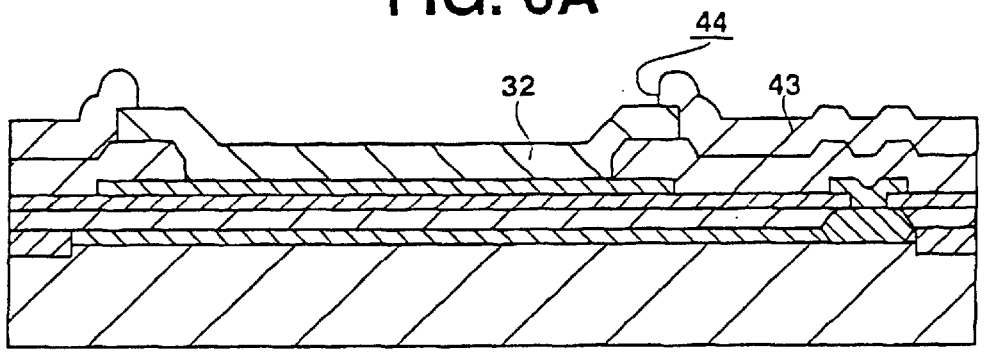
FIGS. 6A through 6C are (third) manufacturing process views of a semiconductor device according to the first preferred embodiment.

Then, as shown in FIG. 6A, for example by CVD, a second interlayer insulating film 43 was formed covering the second conducting layer 32 to a thickness of for example 1.0 μm. Then, by lithography and etching (for example plastic etching or reactive ion etching or the like), an opening 44 exposing the second conducting layer 32 was formed in the second interlayer insulating film 43.

Figure 6B:
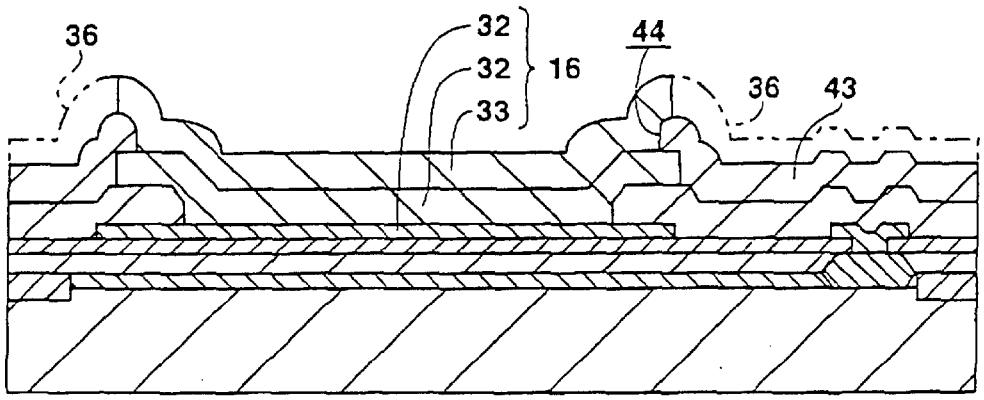

Then, as shown in FIG. 6B, for example by sputtering, a third interconnection layer 36 to constitute an interconnection material was formed over the entire surface of the second interlayer insulating film 43 side. This third interconnection layer 36 consists of for example an aluminum film or a laminated film made up of a titanium (Ti) film and an aluminum-silicon alloy film.

After that, for example by lithography and etching, patterning was carried out to remove the part of the third interconnection layer 36 shown with broken lines, and a third conducting layer 33 connected to the second conducting layer 32 through the opening 44 and constituting part of the pad was formed.

In this way, a pad 16 was made up out of the first conducting layer 31, the second conducting layer 32 and the third conducting layer 33.

Figure 6C:
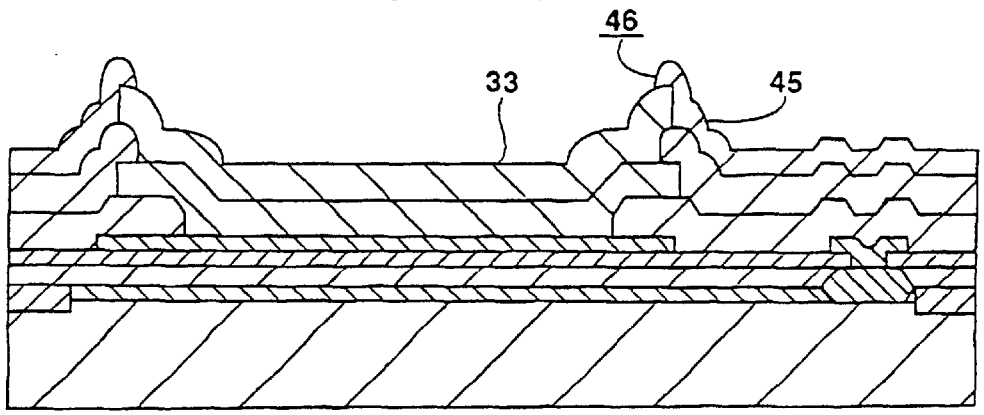

Next, as shown in FIG. 6C, for example by CVD, an overcoat film 45 consisting of for example a silicon nitride film was formed. After that, by lithography and etching (for example plastic etching), an opening 46 exposing the third conducting layer 33 was formed in the overcoat film 45.

Although it is not shown in the drawings, after that, a fourth conducting layer to constitute a wire bonding region was formed.

Figure 7A:
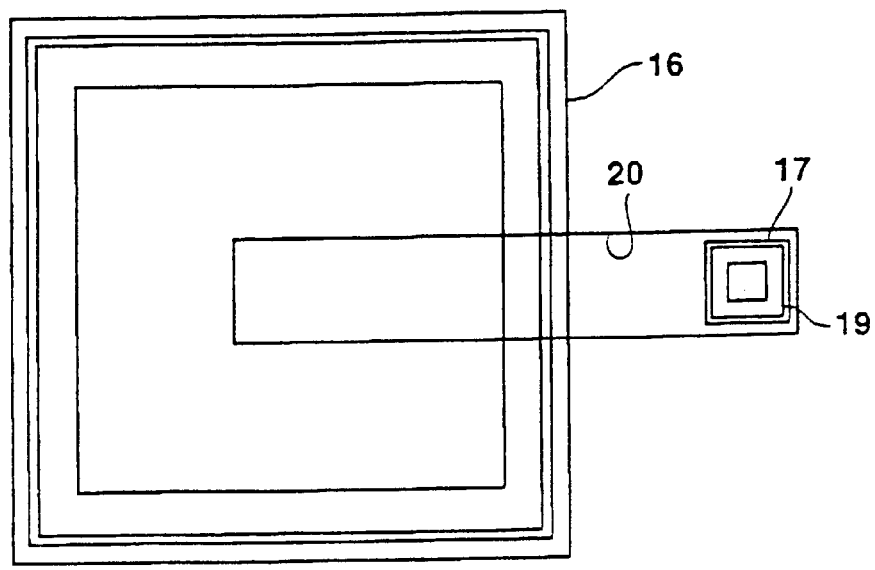
FIGS. 7A and 7B are views illustrating a second preferred embodiment of the first practicing mode.
Figure 7B:
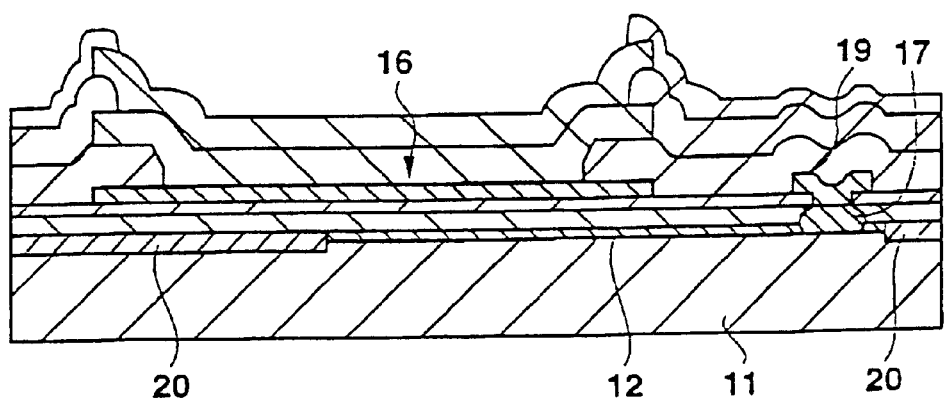

A second preferred embodiment of the first practicing mode will now be described with reference to FIGS. 7A and 7B. FIG. 7A is a layout view and FIG. 7B is a schematic sectional construction view. In the drawings, constituent parts the same as parts described with reference to FIG. 3A to 3B have been given the same reference numerals.

In the semiconductor device shown in FIGS. 7A and 7B, only the disposition of the isolating diffusion layer 20 formed at the boundary between the semiconductor base 11 and the semiconductor layer 12 is different from the semiconductor device described above with reference to FIGS. 3A and 3B, and the other constituent parts and their dispositions are the same as those described above with reference to FIGS. 3A and 3B. Accordingly, the following description will center on the isolating diffusion layer 20.

Thus, an impurity diffusion layer 17 is formed in the semiconductor layer 12 and an electrode 19 is formed on this impurity diffusion layer 17.

The isolating diffusion layer 20 is formed at the boundary between the semiconductor base 11 and the semiconductor layer 12 and outside the side periphery of the impurity diffusion layer 17 and in such a state that the PN junction between the semiconductor base 11 and the semiconductor layer 12 exists in a part of the area below the pad 16 and also in such a state that the semiconductor layer 12 forming this PN junction is connected to the impurity diffusion layer 17.

The method for manufacturing the construction described above with reference to FIGS. 7A and 7B is the same as the manufacturing method described above with reference to FIG. 4A to 4C and FIG. 6A to 6C except that the mask pattern of the isolating diffusion layer 20 is different.

In a semiconductor device of this construction also, because the PN junction capacitance is connected in series with the pad 16, the parasitically connected so-called substrate capacitance of the semiconductor base 11 is reduced.

Also, because the impurity diffusion layer 17 and the electrode 19 for supplying a potential to the semiconductor layer 12 are provided, it is possible to reduce the PN junction capacitance in a depletion layer width by impressing a reverse field across the semiconductor- layer 12 and the semiconductor base 11 from this electrode 19.

Figure 8A:
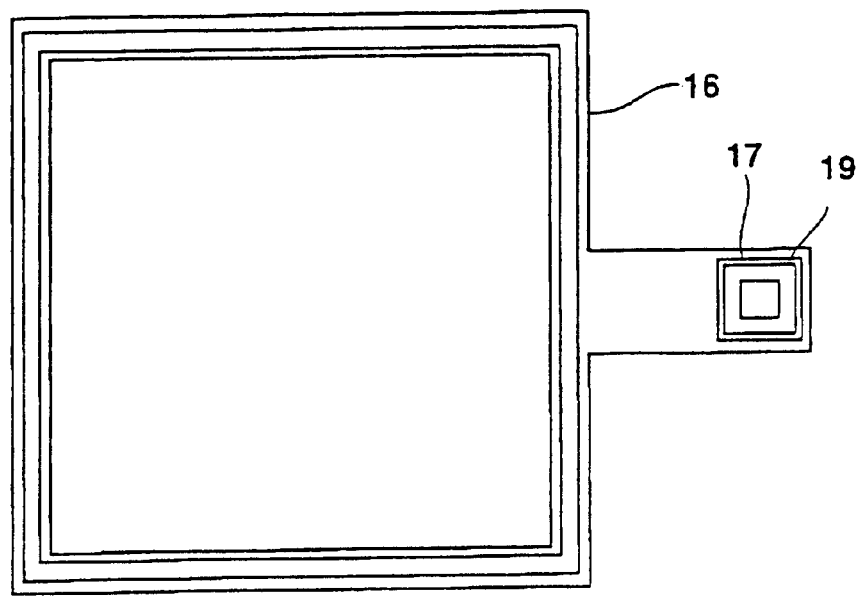
FIGS. 8A and 8B are views illustrating a third preferred embodiment of the first practicing mode.
Figure 8B:
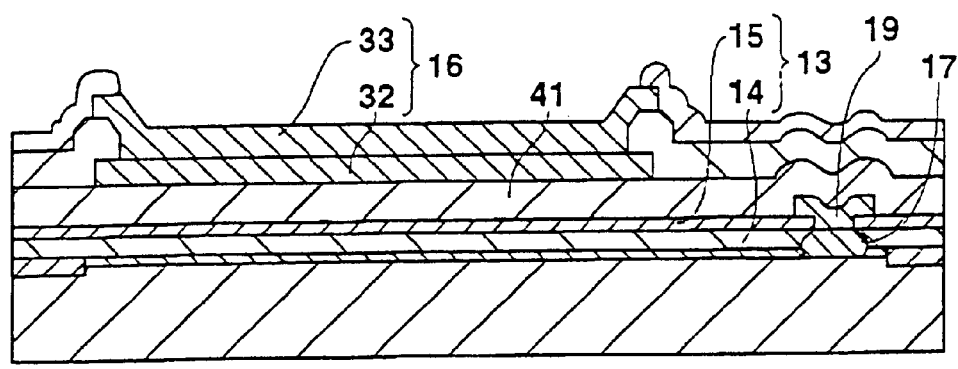

Next, a third preferred embodiment of the first practicing mode will be described with reference to FIGS. 8A and 8B. FIG. 8A is a layout view and FIG. 8B is a schematic sectional construction view. In the drawings, constituent parts the same as parts described with reference to FIGS. 3A and 3B have been given the same reference numerals.

The semiconductor device shown in FIGS. 8A and 8B is the same as that described above with reference to FIGS. 3A and 3B except that the pad 16 is made up of a second conducting layer 32 and a third conducting layer 33 and a first interlayer insulating film 41 is formed on the insulating film 13 (the device separation oxide film 14 and the field oxide film 15) and covering the electrode 19. The electrode 19 is connected to an impurity diffusion layer 17 formed in the semiconductor layer 12. The other constituent parts and their dispositions are the same as those described above with reference to FIGS. 3A and 3B.

Thus, the pad 16 is formed on the first interlayer insulating film 41.

In the semiconductor device described above with reference to FIGS. 8A and 8B, because the insulating film 13 and the first interlayer insulating film 41 exist below the pad 16, the film thickness of the insulating film below the pad 16 is greater than in the construction described above with reference to FIGS. 3A and 3B. As a result, the so-called substrate capacitance is reduced further than in the first and second preferred embodiments described above.

Also, because the impurity diffusion layer 17 and the electrode 19 for supplying a potential to the semiconductor layer 12 are provided, it is possible to reduce the PN junction capacitance in a depletion layer width by impressing a reverse field across the semiconductor layer 12 and the semiconductor base 11 from this electrode 19.

The method for manufacturing the construction described above with reference to FIGS. 8A and 8B is the same as the manufacturing method described above with reference to FIG. 4A to 4C and FIG. 6A to 6C except that the mask pattern for patterning the interconnection layer (not shown) forming the electrode 19 is different.

Figure 9A:
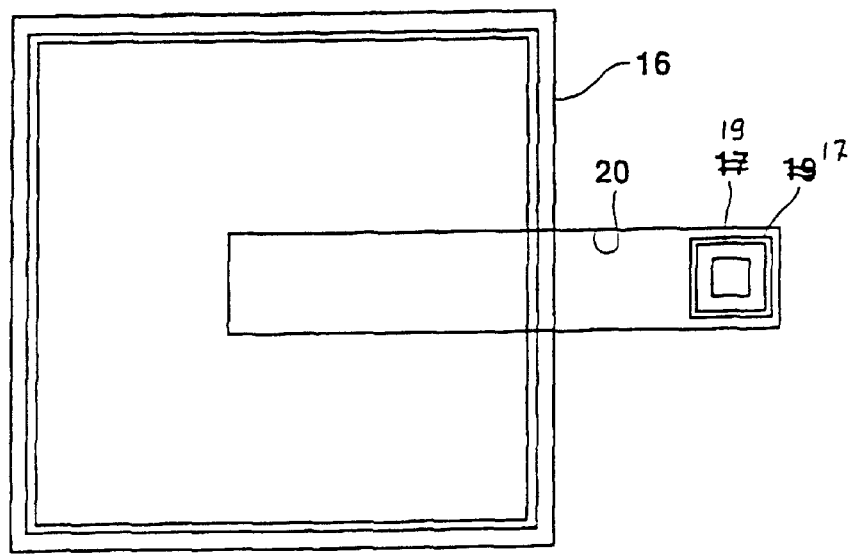
FIGS. 9A and 9B are views illustrating a fourth preferred embodiment of the first practicing mode.
Figure 9B:
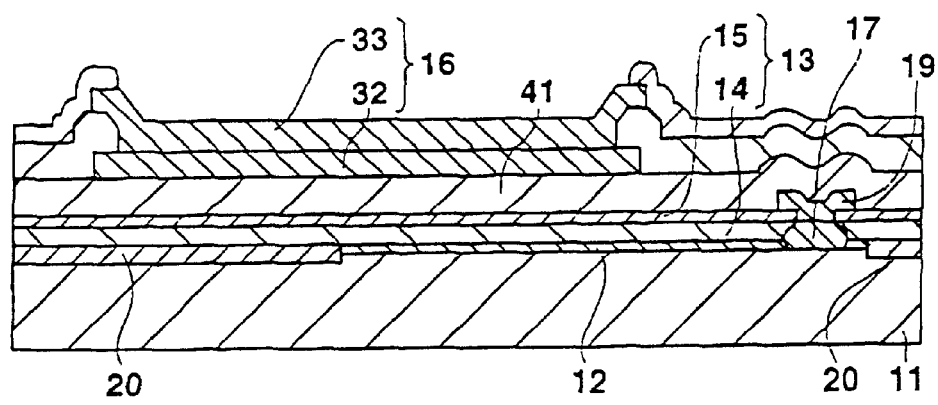

Next, a fourth preferred embodiment of the first practicing mode will be described with reference to FIGS. 9A and 9B. FIG. 9A is a layout view and FIG. 9B is a schematic sectional construction view. In the drawings, constituent parts the same as parts described with reference to FIGS. 7A and 7B have been given the same reference numerals.

The semiconductor device shown in FIGS. 9A and 9B is the same as that described above with reference to FIGS. 7A and 7B except that the pad 16 is made up of a second conducting layer 32 and a third conducting layer 33 and a first interlayer insulating film 41 is formed on the insulating film 13 (the device separation oxide film 14 and the field oxide film 15) and covering the electrode 19. The electrode 19 is connected to an impurity diffusion layer 17 formed in the semiconductor layer 12. The other constituent parts and their dispositions are the same as those described above with reference to FIGS. 7A and 7B.

Therefore, the pad 16 is formed on the first interlayer insulating film 41.

Also, the isolating diffusion layer 20 is formed at the boundary between the semiconductor base 11 and the semiconductor layer 12 and outside the side periphery of the impurity diffusion layer 17 and in such a state that the PN junction between the semiconductor base 11 and the semiconductor layer 12 exists in a part of the area below the pad 16 and also in such a state that the semiconductor layer 12 forming this PN junction is connected to the impurity diffusion layer 17.

In a semiconductor device of the construction described above with reference to FIGS. 9A and 9B, although the PN junction capacitance is the same as in the semiconductor device of the second preferred embodiment described above, because the insulating film 13 and the first interlayer insulating film 41 exist below the pad 16, the film thickness of the insulating film below the pad 16 is greater than in the second preferred embodiment (see FIGS. 7A and 7B). As a result, the so-called substrate capacitance is further reduced.

Also, since the impurity diffusion layer 17 and the electrode 19 for supplying a potential to the semiconductor layer 12 are provided, it is possible to reduce the PN junction capacitance in a depletion layer width by impressing a reverse field across the semiconductor layer 12 and the semiconductor base 11 from this electrode 19.

The method for manufacturing the construction described above with reference to FIGS. 9A and 9B is the same as the manufacturing method described above with reference to FIG. 4A to 4C and FIG. 6A to 6C except that the mask pattern for patterning the interconnection layer (not shown) forming the electrode 19 and the mask pattern for forming the isolating diffusion layer 20 are different.

Figure 10:
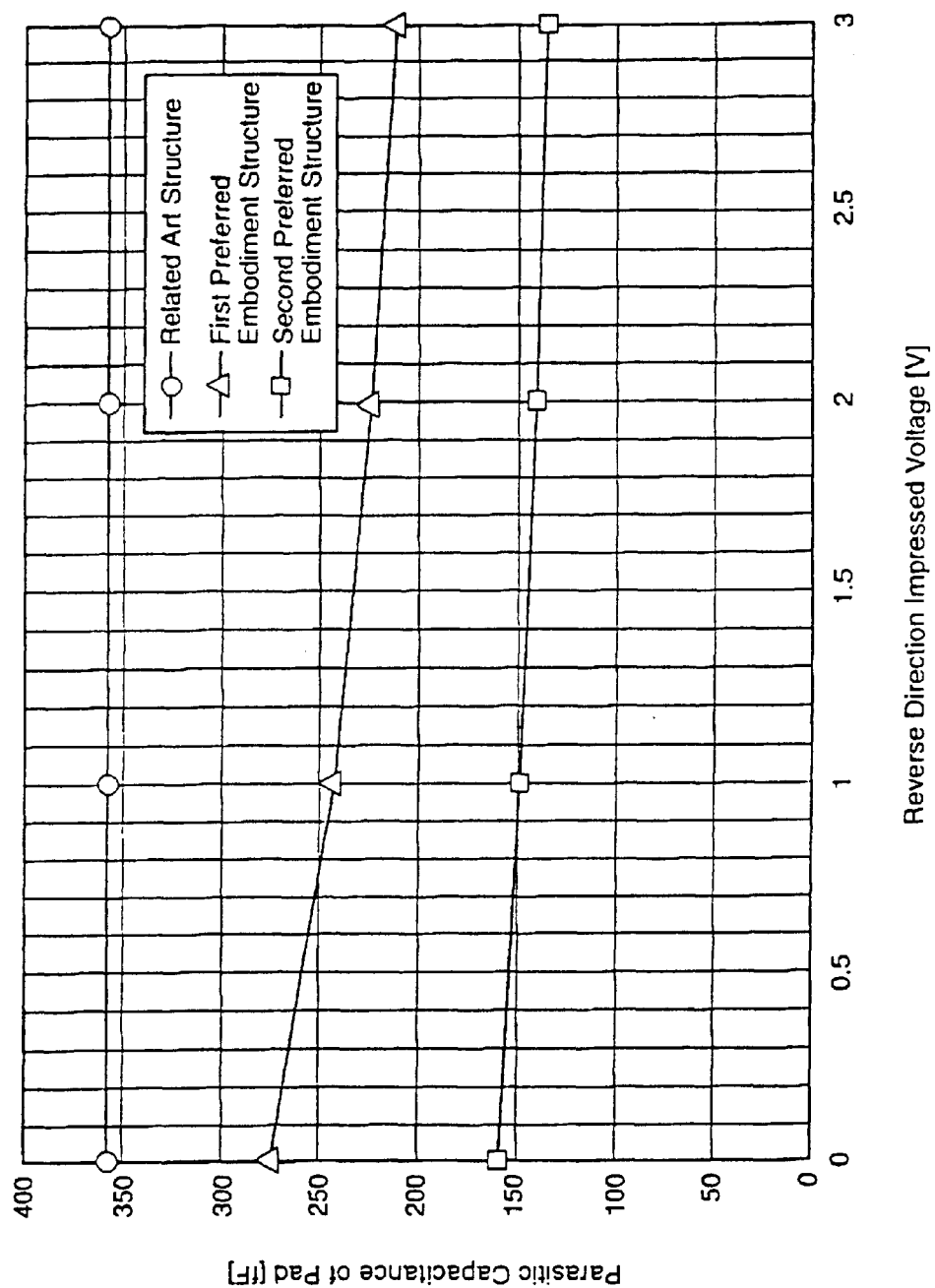
FIG. 10 is a view showing relationships between pad parasitic capacitance and reverse impressed voltage.

Here, the relationship between the parasitic capacitance of the pad and the reverse impressed voltage will be explained with reference to FIG. 10. In FIG. 10, the vertical axis shows the parasitic capacitance of the pad and the horizontal axis shows the reverse impressed voltage.

The case of the construction of the first preferred embodiment is shown with Δ marks, the case of the construction of the second preferred embodiment is shown with ⌑ marks and the case of a related art construction formed with the isolating diffusion layer and the semiconductor base joined below the pad is shown with ○ marks as a comparison example.

As is clear from FIG. 10, with the constructions of the first and second preferred embodiments, the parasitic capacitance of the pad was reduced to below that of the comparison example for all values of the reverse impressed voltage. The size of this reduction was about 24% with the construction of the first preferred embodiment and about 56% with the construction of the second preferred embodiment even when the reverse impressed voltage was 0 V. When the reverse impressed voltage was 3 V, the size of the reduction was about 42% with the construction of the first preferred embodiment and about 62% with the construction of the second preferred embodiment.

Thus, with a structure according to this invention, it was possible to greatly reduce the so-called substrate capacitance.

Figure 11:
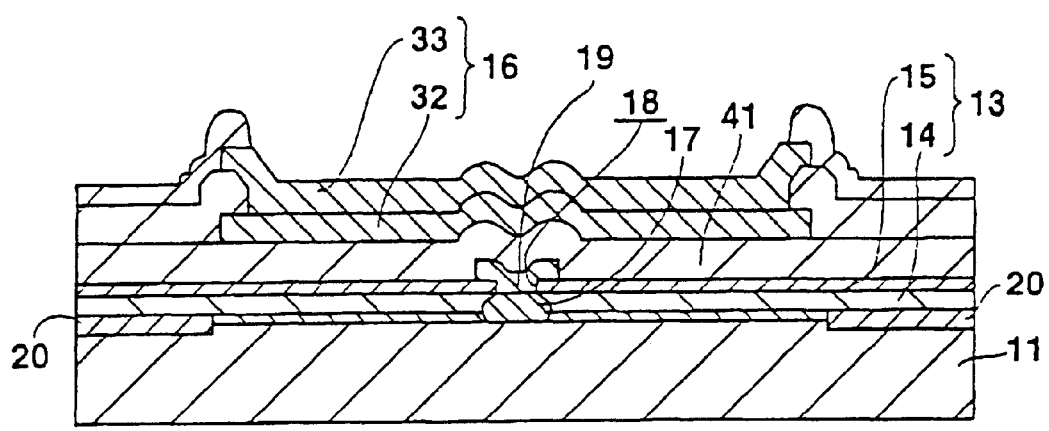
FIG. 11 is a schematic sectional construction view of a second practicing mode of the invention.

Next, a second practicing mode of the invention will be described with reference to the schematic sectional construction view of FIG. 11. In FIG. 11, constituent parts the same as parts described above with reference to FIG. 2 have been given the same reference numerals.

In the semiconductor device shown in FIG. 11, the pad 16 is made up of a second conducting layer 32 and a third conducting layer 33. The impurity diffusion layer 17 formed in the semiconductor layer 12, the connecting hole 18 formed in the insulating film 13 (the device separation oxide film 14 and the field oxide film 15) and the electrode 19 connected to the impurity diffusion layer 17 are disposed below the region where the pad 16 is formed. A first conductive type (P-type) isolating diffusion layer 20 is formed at the boundary between the semiconductor base 11 and the semiconductor layer 12 in such a state that the PN junction between the semiconductor base 11 and the semiconductor layer 12 exists in at least a part of the area below the pad 16. Also, a first interlayer insulating film 41 is formed on the insulating film 13 and covering the electrode 19. Other constituent parts and their dispositions are the same as those described above with reference to FIG. 2.

Therefore, the pad 16 is formed on the first interlayer insulating film 41.

With a construction wherein as described above with reference to FIG. 11 the impurity diffusion layer 17 and the connecting hole 18 and the electrode 19 are disposed below the pad 16, because the area occupied by the impurity diffusion layer 17, the connecting hole 18 and the electrode 19 is relatively small compared to the pad, there are no restrictions of area on their formation. Since the degree of freedom of the design layout is therefore raised, this contributes to increasing the level of integration.

Figure 12A:
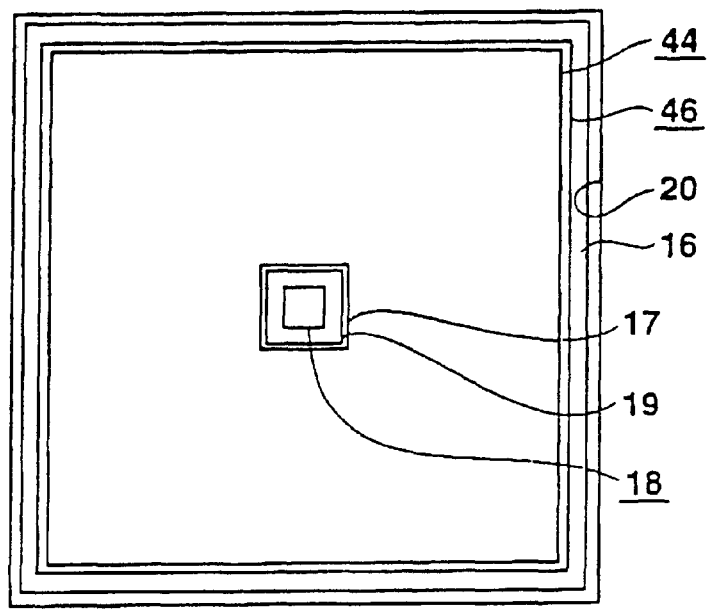
FIGS. 12A and 12B are views illustrating a first preferred embodiment of the second practicing mode.
Figure 12B:
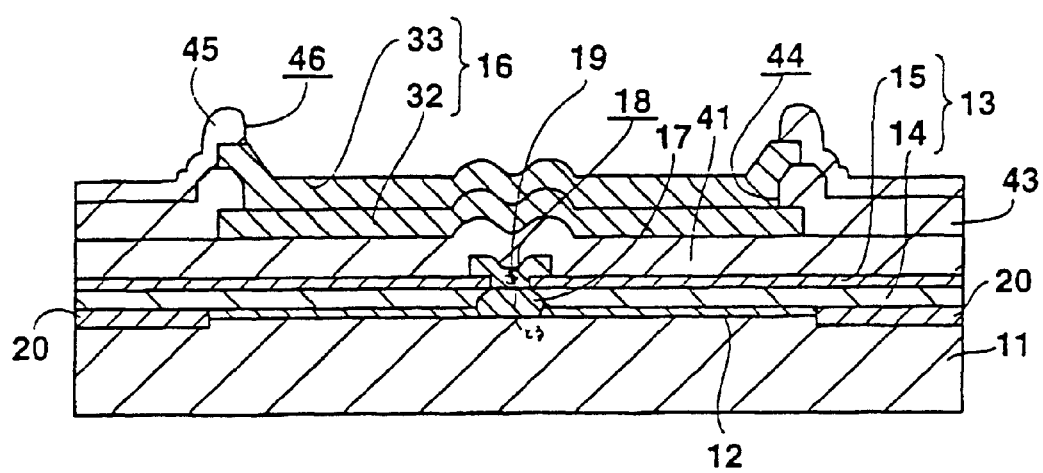

Next, a first preferred embodiment of the second practicing mode will be described with reference to FIGS. 12A and 12B. FIG. 12A is a layout view and FIG. 12B is a schematic sectional construction view. Constituent parts the same as parts described above with reference to FIGS. 3A and 3B and FIG. 11 have been given the same reference numerals.

As shown in FIG. 11, the construction of the semiconductor base 11, the semiconductor layer 12 and the insulating film 13 (the device separation oxide film 14 and the field oxide film 15) is the same as that described above with reference to FIGS. 3A and 3B.

Also, a second conductive type (N-type) impurity diffusion layer 17 connected to the semiconductor layer 12 is formed in the semiconductor layer 12 below the pad 16 made up of the second conducting layer 32 and the third conducting layer 33. The connecting hole 18 is formed in the insulating film 13 above this impurity diffusion layer 17, and the electrode 19 is formed in this connecting hole 18 in such a state that it is electrically independent from the pad 16 and connected to the impurity diffusion layer 17.

Also, a first interlayer insulating film 41 is formed on the insulating film 13 and covering the electrode 19.

Therefore, the pad 16 is formed on the first interlayer insulating film 41. A second interlayer insulating film 43 is formed covering the second conducting layer 32 of the pad 16. A connection opening 44 is formed on this second interlayer insulating film 43, and the third conducting layer 33 is connected to the second conducting layer 32 through this opening 44. A so-called overcoat film 45 is formed covering the third conducting layer 33, and a connection opening 46 exposing the third conducting layer 33 is formed in this overcoat film 45.

Also, a first conductive type (P-type) isolating diffusion layer 20 is formed at the boundary between the semiconductor base 11 and the semiconductor layer 12 outside the side periphery of the impurity diffusion layer 17 and in such a state that the PN junction between the semiconductor base 11 and the semiconductor layer 12 exists over the entire area below the pad 16. Furthermore, the junction between the semiconductor layer 12 and the semiconductor base 11 remains in such a state that it connects the area below the pad 16 to the impurity diffusion layer 17.

The method for manufacturing the construction described above with reference to FIGS. 12A and 12B is the same as the manufacturing method described above with reference to FIG. 4A to 4C and FIG. 6A to 6C apart from the point that the formation position of the impurity diffusion layer 17, the connecting hole 18 and the electrode 19 is different and the point that the pad 16 is made up of the second and third conducting layers 32 and 33 and no first conducting layer was formed.

With a semiconductor device of the construction described above with reference to FIGS. 12A and 12B, the same effects as those described with reference to the second practicing mode were obtained.

That is, because the area occupied by the impurity diffusion layer 17, the connecting hole 18 and the electrode 19 is relatively small compared to the pad 16, there are no restrictions of area on their formation. Since the degree of freedom of the design layout is therefore raised, this contributes to increasing the level of integration.

Also, the same effects as the semiconductor device described above with reference to FIGS. 3A and 3B were obtained.

That is, because the PN junction between the semiconductor base 11 and the semiconductor layer 12 exists over the entire area below the pad 16, this PN junction capacitance is connected in series with the pad 16. As a result, the parasitically connected so-called substrate capacitance of the semiconductor base 11 was reduced.

Also, because there are provided the impurity diffusion layer 17 and the electrode 19 for impressing a potential on the semiconductor layer 12, it is possible to impress a reverse field across the semiconductor layer 12 and the semiconductor base 11 from this electrode 19. As a result, it is possible to reduce the PN junction capacitance in a depletion layer.

Figure 13A:
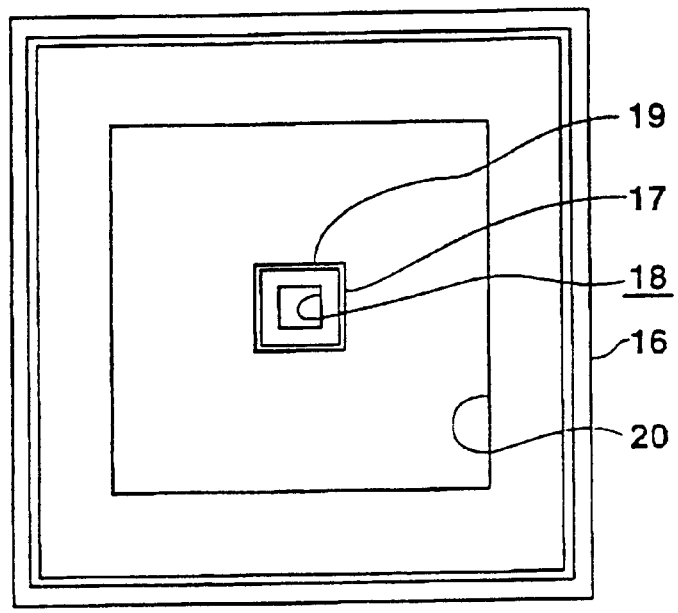
FIGS. 13A and 13B are views illustrating a second preferred embodiment of the second practicing mode.
Figure 13B:
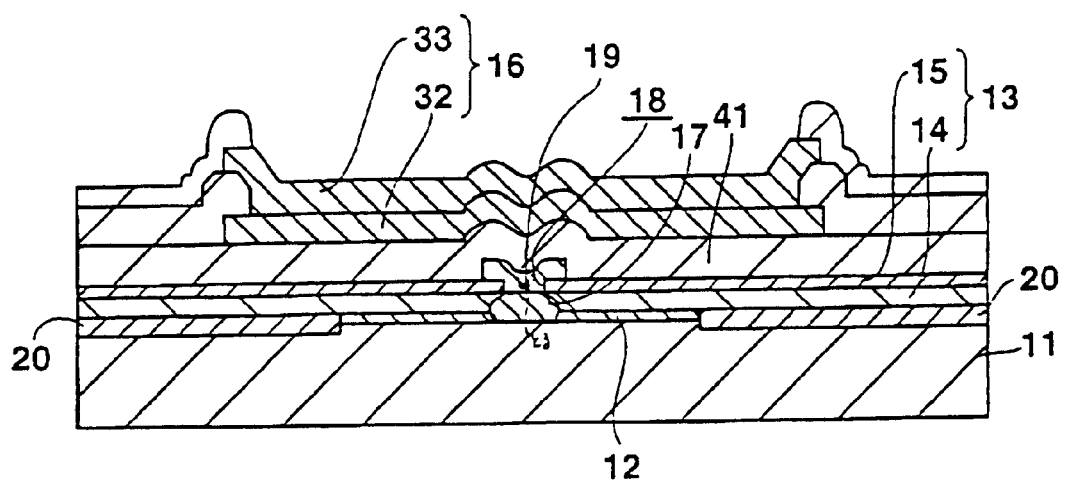

Next, a second preferred embodiment of the second practicing mode will be described with reference to FIGS. 13A and 13B. FIG. 13A is a layout view and FIG. 13B is a schematic sectional construction view. In the drawings, constituent parts the same as parts described above with reference to FIGS. 3A and 3B and FIGS. 12A and 12B have been given the same reference numerals.

In the semiconductor device shown in FIGS. 13A and 13B, only the disposition of the isolating diffusion layer 20 formed at the boundary between the semiconductor base 11 and the semiconductor layer 12 is different from the semiconductor device described above with reference to FIGS. 12A and 12B, and the other constituent parts and their dispositions are the same as those described above with reference to FIG. 3A and 3B. Accordingly, the following description will center on the isolating diffusion layer 20.

The isolating diffusion layer 20 is formed at the boundary between the semiconductor base 11 and the semiconductor layer 12 and outside the side periphery of the impurity diffusion layer 17 and in such a state that the PN junction between the semiconductor base 11 and the semiconductor layer 12 exists in a part of the area below the pad 16 made up of the second conducting layer 32 and the third conducting layer 33 and also in such a state that the semiconductor layer 12 forming this PN junction is connected to the impurity diffusion layer 17.

The method for manufacturing the construction described above with reference to FIGS. 13A and 13B is the same as the manufacturing method described above with reference to FIG. 4A to 4C and FIG. 6A to FIG. 6C except for the point that the formation position of the impurity diffusion layer 17, the connecting hole 18 formed in the insulating film 13 (the device separation oxide film 14 and the field oxide film 15) and the electrode 19 is different and the point that no first conducting layer of the pad 16 is formed and the point that the mask pattern for forming the isolating diffusion layer 20 is different.

With the semiconductor device of the second preferred embodiment of the construction described above with reference to FIGS. 13A and 13B, the same effects as those of the semiconductor device of the first preferred embodiment described above with reference to FIGS. 12A and 12B were obtained.

Figure 14:
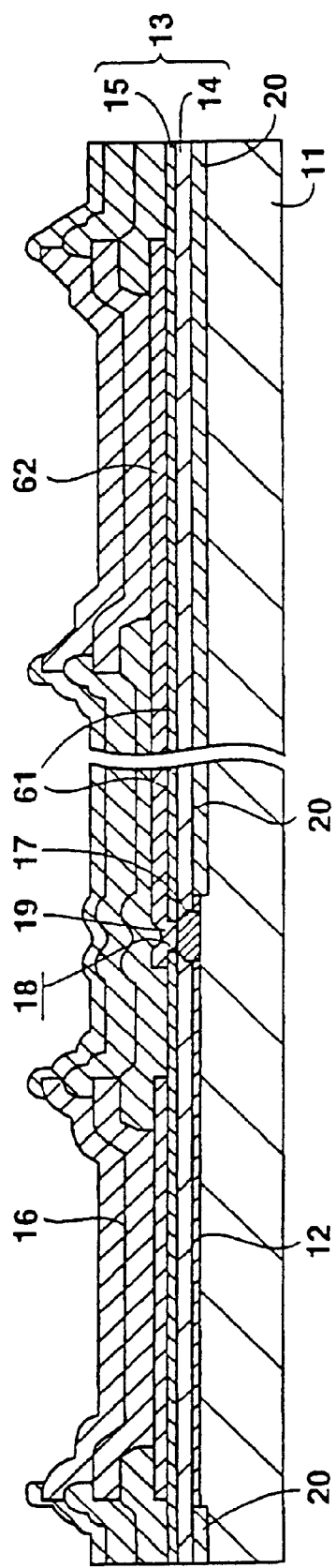
FIG. 14 is a schematic sectional construction view of a third practicing mode of the invention.

Next, a third practicing mode of the invention will be described with reference to the schematic sectional construction view of FIG. 14. In FIG. 14, constituent parts the same as parts described above with reference to FIG. 2 and FIG. 11 have been given the same reference numerals.

As shown in FIG. 14, a semiconductor layer 12, an insulating film 13 (a device separation oxide film 14 and a field oxide film 15), a pad 16, an impurity diffusion layer 17, a connecting hole 18, an electrode 19 and a isolating diffusion layer 20 are formed on a semiconductor base 11 as in the first preferred embodiment described above with reference to FIGS. 3A and 3B.

An interconnection 61 connected to the electrode 19 is formed on the insulating film 13. Also, a power supply pad 62 connected to the interconnection 61 is formed on the insulating film 13. This power supply pad 62 has for example the same construction as the pad 16.

The structure below the interconnection 61 and the power supply pad 62 may for example be the same as the structure below the pad 16.

In a construction wherein a power supply pad 62 connected to the electrode 19 by an interconnection 61 is formed as described above, a potential is impressed on the electrode 19 from outside by way of the power supply pad 62.

As a result of it being possible to impress a potential on the electrode 19 in this way, it is possible to reduce the PN junction capacitance formed by the semiconductor base 11 and the semiconductor layer 12.

Figure 15A:
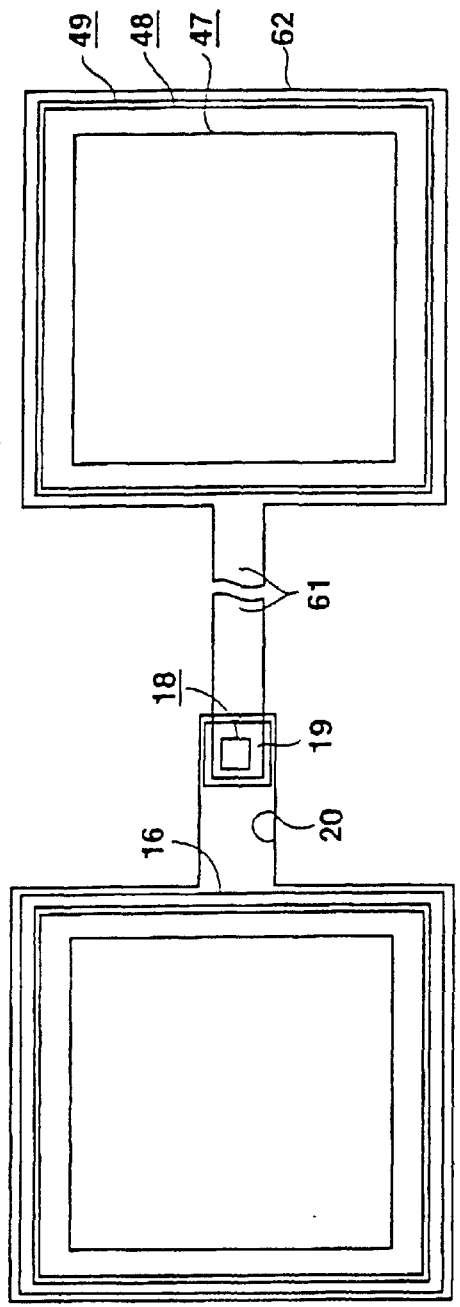
FIGS. 15A and 15B are views illustrating a first preferred embodiment of the third practicing mode.

Next, a first preferred embodiment of the third practicing mode will be described with reference to FIGS. 15A and 15B. FIG. 15A is a layout view and FIG. 15B is a schematic sectional construction view.

In the drawings, constituent parts the same as parts described above with reference to FIGS. 3A and 3B and FIG. 14 have been given the same reference numerals.

Figure 15B:
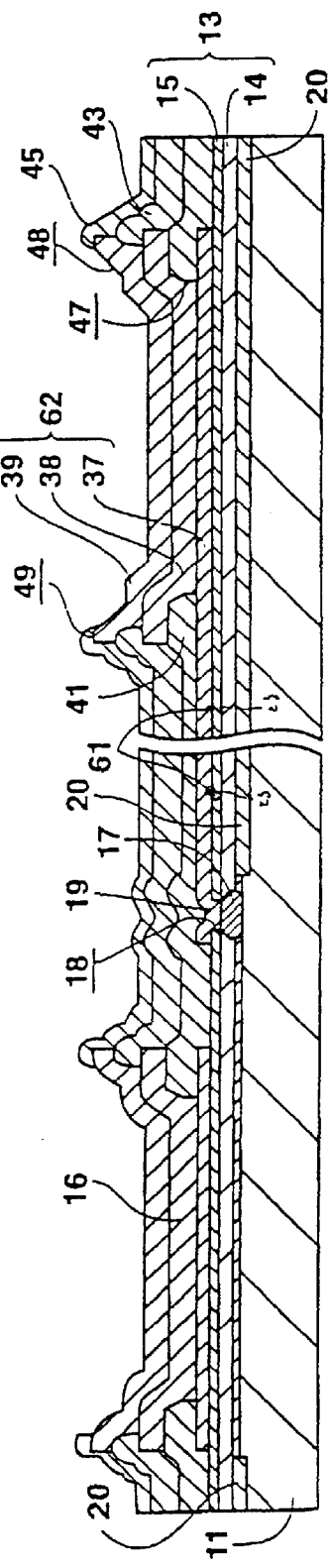

As shown in FIGS. 15A and 15B, a semiconductor layer 12, an insulating film 13 (a device separation oxide film 14 and a field oxide film 15), a pad 16, an impurity diffusion layer 17, a connecting hole 18, an electrode 19 and a isolating diffusion layer 20 are formed on a semiconductor base 11 as in the semiconductor device described above with reference to FIGS. 3A and 3B.

A power supply pad 62 connected to the electrode 19 by an interconnection 61 is formed on the insulating film 13.

The power supply pad 62 is made up of conducting layers, for example three layers of an aluminum-based metal. Specifically, a first conducting layer 37 is formed on the insulating film 13. This first conducting layer 37 was formed with the same layer as the first conducting layer 31 of the electrode 19 and the pad 16. Then a first interlayer insulating film 41 is formed on the first conducting layer 37. An opening 47 is then formed in the first interlayer insulating film 41 on the first conducting layer 37, and a second conducting layer 38 is connected to the first conducting layer 37 through this opening 47. A second interlayer insulating film 43 is further formed covering the second conducting layer 38. A connection opening 48 is formed in this second interlayer insulating film 43, and a third conducting layer 39 is connected to the second conducting layer 38 through this opening 48. A so-called overcoat film 45 is formed covering the third conducting layer 39, and a connection opening 49 exposing the third conducting layer 39 is formed in this overcoat film 45.

Next, a second preferred embodiment of the third practicing mode will be described with reference to FIGS. 16A and 16B. FIG. 16A is a layout view and FIG. 16B is a schematic sectional construction view.

In the drawings, constituent parts the same as parts described above with reference to FIGS. 3A and 3B and FIG. 14 have been given the same reference numerals.

As shown in FIGS. 16A and 16B, a semiconductor layer 12, an insulating film 13 (a device separation oxide film 14 and a field oxide film 15), a pad 16, an impurity diffusion layer 17, a connecting hole 18, an electrode 19 and a isolating diffusion layer 20 are formed on a semiconductor base 11 in the same way as in the semiconductor device described above with reference to FIGS. 8A and 8B.

A power supply pad 62 connected to the electrode 19 by an interconnection 61 is formed on the insulating film 13.

The power supply pad 62 is made up of conducting layers, for example three layers of an aluminum-based metal. That is, it is of the same construction as that shown in FIGS. 15A and 15B.

The formation positions of the interconnection 61 and the power supply pad 62 described above with reference to FIGS. 15A and 15B and FIGS. 16A and 16B are not limited to on the insulating film 13, and for example a connecting hole (not shown) exposing the electrode 19 may be formed in the first interlayer insulating film 41 and the interconnection 61 may be formed connected to the electrode 19 through this connecting hole. The power supply pad 62 in this case is formed on the first interlayer insulating film 41. In this case, the parasitic capacitance of the power supply pad 62 is also reduced.

Figure 17A:
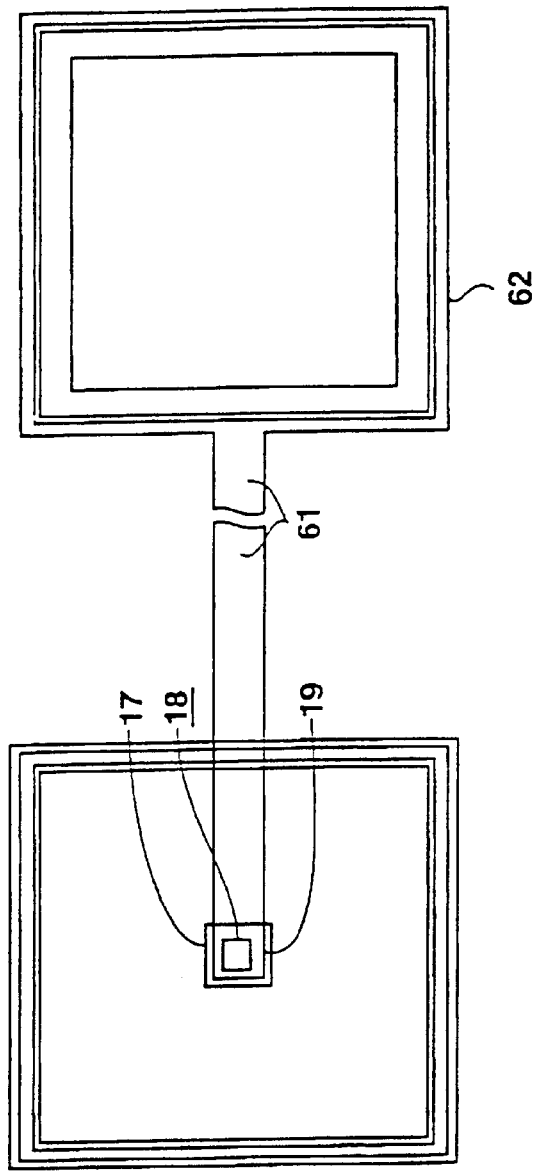
FIGS. 17A and 17B are views illustrating a third preferred embodiment of the third practicing mode.

Next, a third preferred embodiment of the third practicing mode will be described with reference to FIGS. 17A and 17B. FIG. 17A is a layout view and FIG. 17B is a schematic sectional construction view.

In the drawings, constituent parts the same as parts described above with reference to FIGS. 3A and 3B and FIG. 14 have been given the same reference numerals.

Figure 17B:
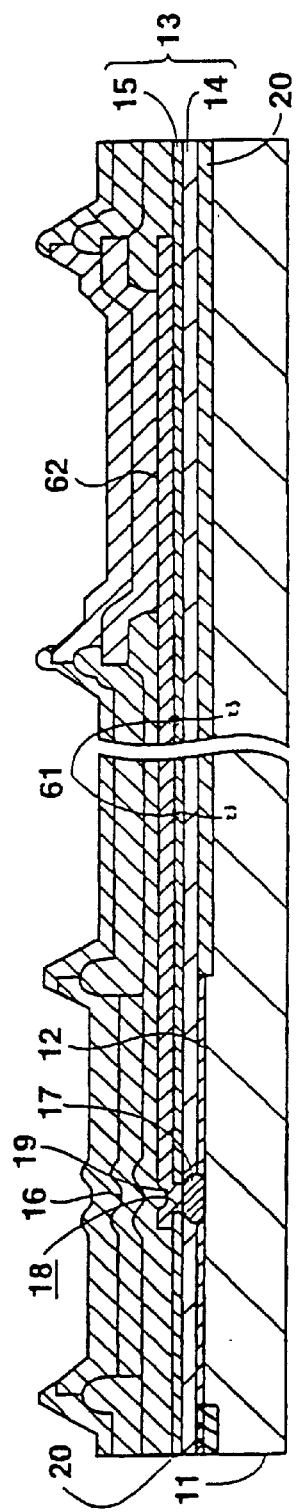

As shown in FIGS. 17A and 17B, a semiconductor layer 12, an insulating film 13 (a device separation oxide film 14 and a field oxide film 15), a pad 16, an impurity diffusion layer 17, a connecting hole 18, an electrode 19 and a isolating diffusion layer 20 are formed on a semiconductor base 11 in the same way as in the semiconductor device described above with reference to FIGS. 8A and 8B.

A power supply pad 62 is connected to the electrode 19 by way of an interconnection 61 is formed on the insulating film 13.

The power supply pad 62 is made up of conducting layers, for example three layers of an aluminum-based metal. That is, it is of the same construction as that shown in FIGS. 15A and 15B.

Thus, according to this invention, because a PN junction between a semiconductor base of a first conductive type and a semiconductor layer of a second conductive type exists in at least a part of the area below a pad, this PN junction capacitance is in series with the pad. As a result, it is possible to reduce the parasitically connected so-called substrate (semiconductor base) capacitance.

Also, because an impurity diffusion layer of the second conductive type and connected to the semiconductor layer of the second conductive type is formed in the semiconductor layer and an electrode is formed connected to this impurity diffusion layer, it is possible to impress a reverse field across the semiconductor layer and the semiconductor base from this electrode. As a result, it is possible to reduce the PN junction capacitance in a depletion layer width.

Also, according to an aspect of the invention wherein an interlayer insulating film is formed below the pad and covering the electrode, the insulating film below the pad increases in thickness by the film thickness of the interlayer insulating film. As a result, the so-called substrate capacitance can be further reduced.

What is claimed is:

1. A semiconductor device comprising:

a semiconductor base;

a semiconductor layer of a first conductive type formed above said semiconductor base;

an insulating film formed on said semiconductor layer;

a pad comprising a conducting film formed on said insulating film;

an impurity diffusion layer of said first conductive type connected to said semiconductor layer;

an electrode electrically independent from said pad and connected to said impurity diffusion layer through a connecting hole formed in said insulating film above said impurity diffusion layer, wherein a PN junction between said semiconductor base and said semiconductor layer exists in at least a part of the area below said pad.

2. A semiconductor device according to claim 1 wherein:

said electrode impresses a reverse field across said semiconductor base and said semiconductor layer.

3. A semiconductor device according to claim 1 wherein:

said impurity diffusion layer and said connecting hole and said electrode are disposed to one side of said pad.

4. A semiconductor device according to claim 3 wherein:

an interlayer insulating film covering said electrode is formed on said insulating film and said pad is formed on said interlayer insulating film.

5. A semiconductor device according to claim 1 wherein:

said impurity diffusion layer and said connecting hole and said electrode are disposed below said pad and an interlayer insulating film covering said electrode is provided between said insulating film and said pad.

6. A semiconductor device according to claim 1 further comprising:

an interconnection formed on said insulating film and connected to said electrode; and a power supply pad formed on said insulating film and connected to said interconnection.

7. A semiconductor device according to claim 3 further comprising:

an interconnection formed on said insulating film and connected to said electrode; and a power supply pad formed on said insulating film and connected to said interconnection.

8. A semiconductor device according to claim 4 further comprising:

an interconnection formed on said insulating film and connected to said electrode; and a power supply pad formed on said insulating film and connected to said interconnection.

9. A semiconductor device according to claim 5 further comprising:

an interconnection formed on said interlayer insulating film and connected to said electrode; and a power supply pad formed on said interlayer insulating film and connected to said interconnection.

\* \* \* \* \*